(12) United States Patent
Wan

(10) Patent No.: US 8,413,788 B2
(45) Date of Patent: Apr. 9, 2013

(54) TURNING MECHANISM FOR POLARIZED ELECTRONIC COMPONENTS

(76) Inventor: Zhao-Lin Wan, Kaohsiung (TW)

( * ) Notice: Subject to any disclaimer, the term of this patent is extended or adjusted under 35 U.S.C. 154(b) by 207 days.

(21) Appl. No.: 13/072,768

(22) Filed: Mar. 27, 2011

(65) Prior Publication Data

US 2012/0241286 A1   Sep. 27, 2012

(51) Int. Cl.
*B65G 47/24* (2006.01)
(52) U.S. Cl.
USPC ........... 198/380; 198/401; 198/394; 198/381; 198/397.02; 198/399; 414/222.01
(58) Field of Classification Search .................. 198/393, 198/397.02, 395, 397.01, 803.5, 445, 401, 198/380, 373; 406/52, 62, 78, 86, 87; 414/786, 414/755, 754, 758
See application file for complete search history.

(56) References Cited

U.S. PATENT DOCUMENTS

| 6,869,262 | B2 * | 3/2005 | Yamashita et al. ............ 414/217 |
| 7,390,158 | B2 * | 6/2008 | Takagi et al. ............ 414/222.01 |
| 2008/0217136 | A1 * | 9/2008 | Ikeda ............................ 198/380 |
| 2009/0095598 | A1 * | 4/2009 | Stoiber et al. ................. 198/617 |

* cited by examiner

*Primary Examiner* — Gene Crawford
*Assistant Examiner* — Lester Rushin

(57) ABSTRACT

A turning mechanism includes a disc-shaped rotatable carriage comprising receptacles spaced around an edge, each receptacle being adapted to receive one of polarized electronic component and including an air channel; a turn channel projecting out of the edge of the carriage, the turn channel being arc and comprising an inlet communicating with one receptacle and including a first sensor, and an outlet communicating with another receptacle and including a second sensor; an auxiliary air passageway proximate to the first sensor and projecting inward out of the turn channel, the auxiliary air passageway communicating with the turn channel and comprising an air outlet; and a polarity detector disposed externally of the carriage and being proximate to the inlet, the polarity detector being adapted to detect polarity of the polarized electronic component proximate thereto.

9 Claims, 11 Drawing Sheets

TURNING MECHANISM FOR POLARIZED ELECTRONIC COMPONENTS

BACKGROUND OF THE INVENTION

1. Field of Invention

The invention relates to polarized electronic components (e.g., inductors, capacitors, light-emitting diodes (LEDs), and integrated circuits (ICs)) and more particularly to an improved turning mechanism for the polarized electronic components.

2. Description of Related Art

Two techniques are typically used to package polarized electronic components as detailed below. The first one employs an arm to turn polarized electronic components to a desired direction. However, its cost is relatively high and maintenance is difficult. Moreover, repair time is relatively long if there are malfunctioned components to be replaced with new ones. This can adversely lower the yield.

The second one is done after the packaging. It rearranges those polarized electronic components not passing the packaging process due to reverse polarities. Further, they are conveyed to a next stage for packaging. The second one is not done sequentially, i.e., being disrupted. Hence, its performance is poor and it is time consuming.

Thus, the need for improvement still exists.

SUMMARY OF THE INVENTION

It is therefore one object of the invention to provide turning apparatus comprising a disc-shaped rotatable carriage comprising a plurality of receptacles spaced around an edge, each receptacle being adapted to receive one of a plurality of polarized electronic component and including an air channel; a turn channel projecting out of the edge of the carriage, the turn channel being arc and comprising an inlet communicating with one of the receptacles and including a first sensor, and an outlet communicating with an adjacent one of the receptacles and including a second sensor; an auxiliary air passageway disposed proximate to the first sensor and projecting inward out of the turn channel, the auxiliary air passageway communicating with the turn channel and comprising an air outlet; and a polarity detector disposed externally of the carriage and being proximate to the inlet, the polarity detector being adapted to detect polarity of the polarized electronic component proximate thereto.

The above and other objects, features and advantages of the invention will become apparent from the following detailed description taken with the accompanying drawings.

DETAILED DESCRIPTION OF THE INVENTION

Figure 1:
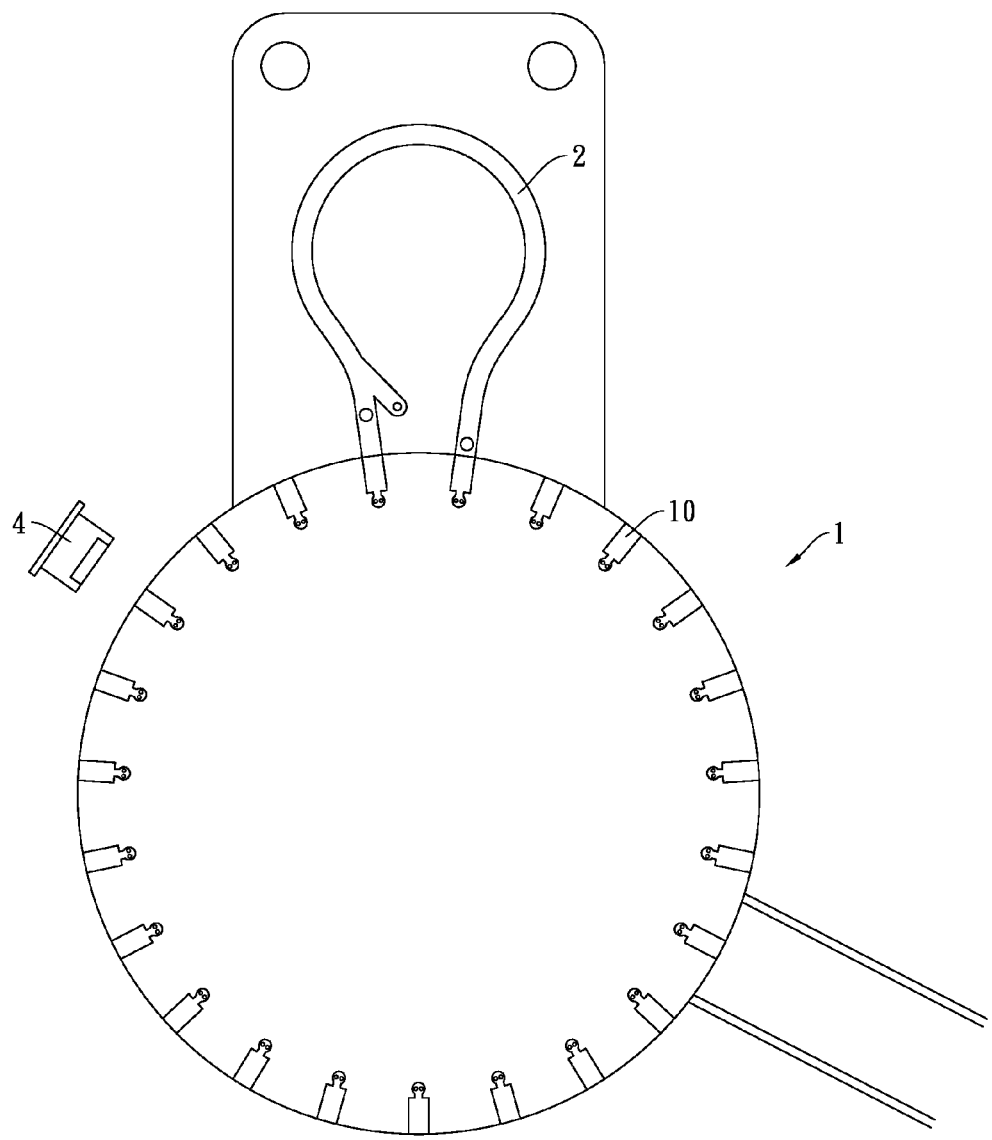
FIG. 1 is a top plan view of a turning mechanism for polarized electronic components according to a first preferred embodiment of the invention.
Figure 2:
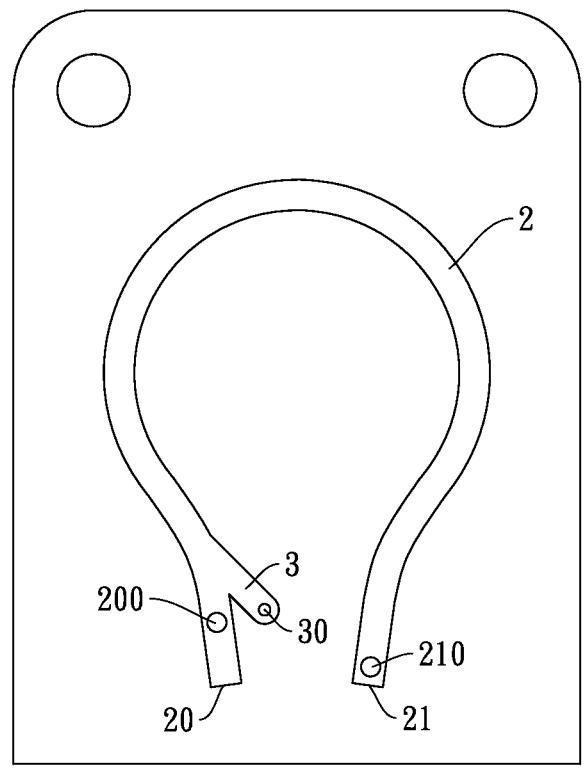
FIG. 2 is an enlarged view of the turning mechanism.
Figure 3:
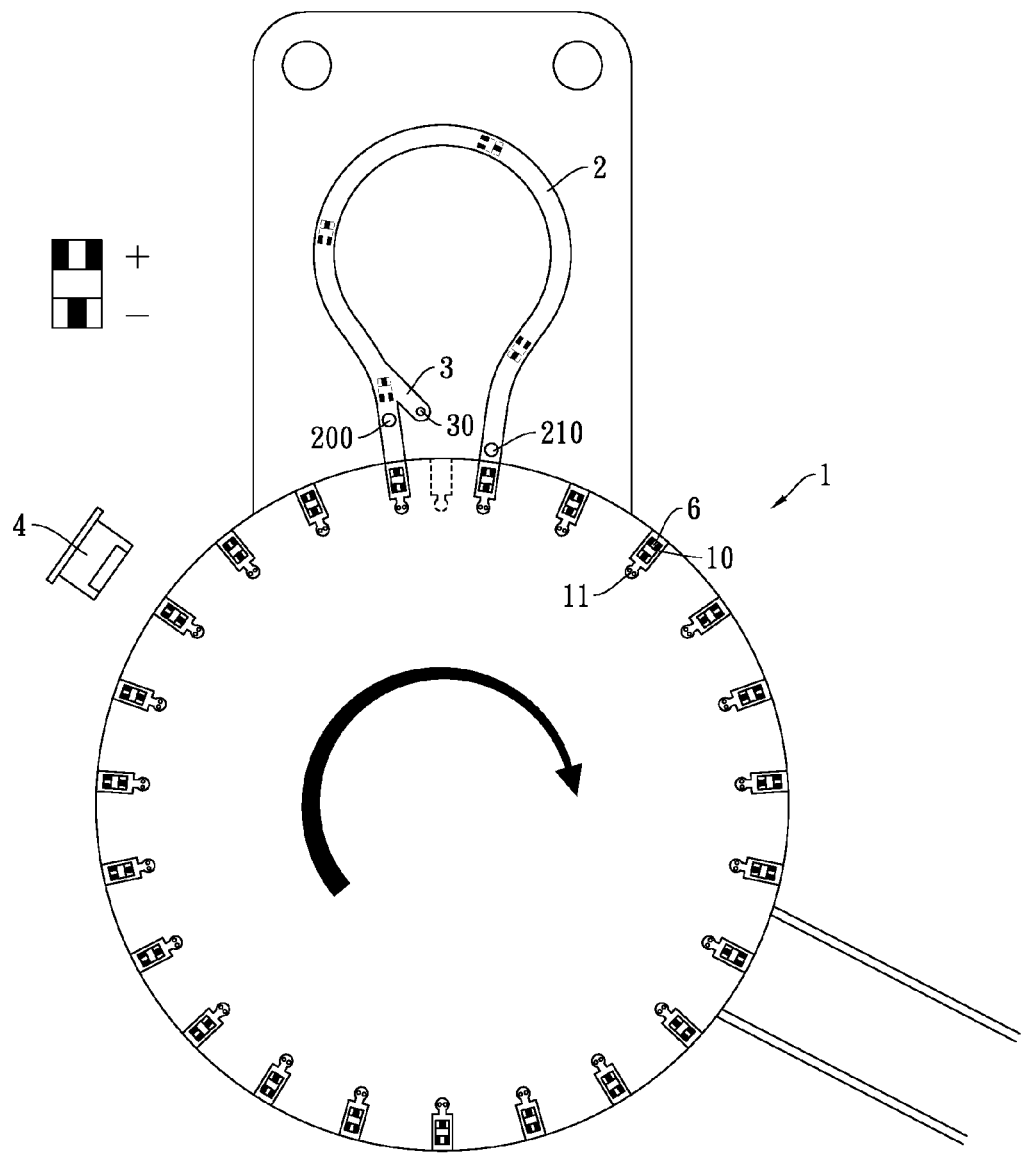
FIG. 3 is a view similar to FIG. 1 showing polarized electronic components loaded on the carriage being turned by the turning mechanism.
Figure 4:
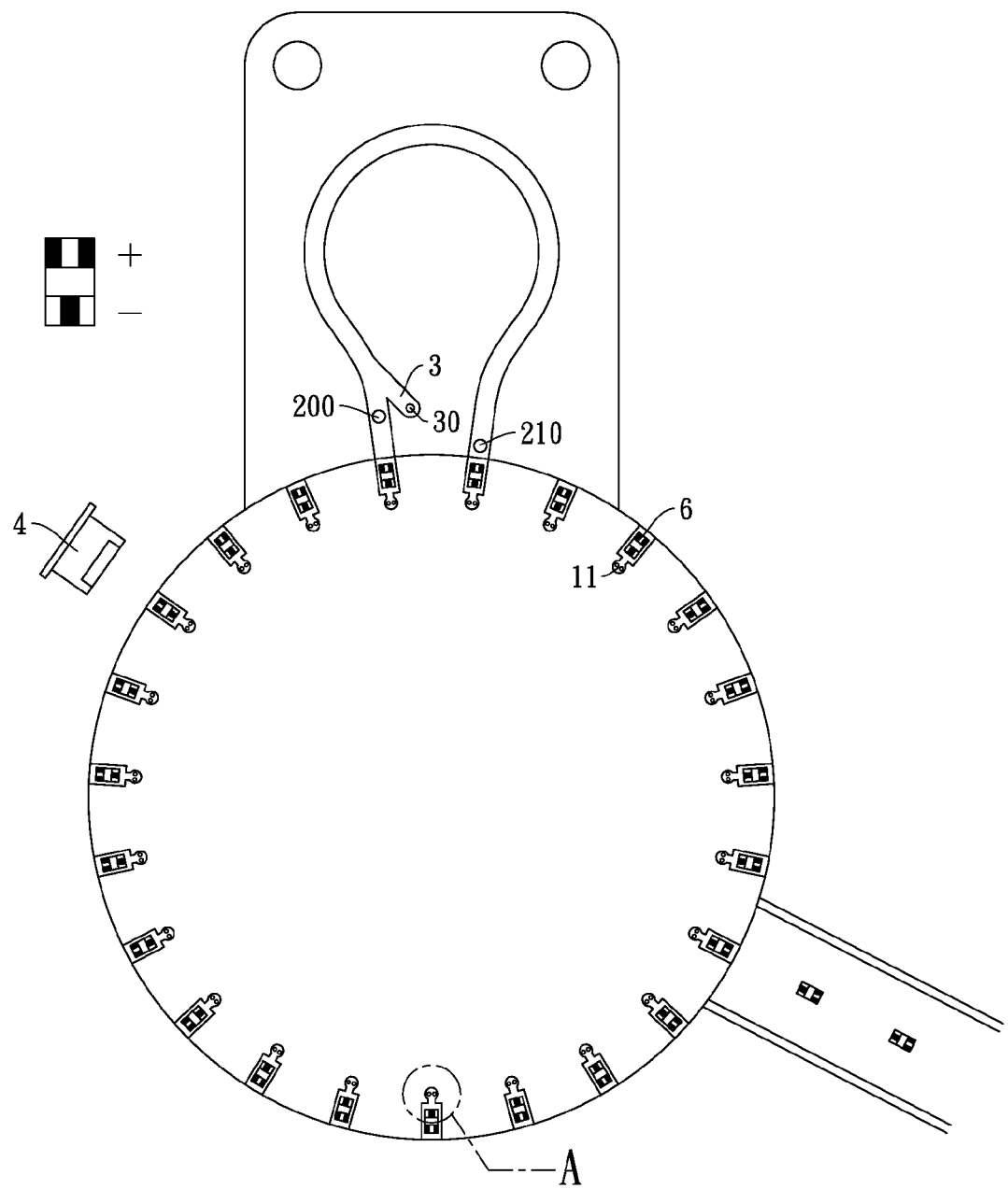
FIG. 4 is a view similar to FIG. 3 showing the polarized electronic components after the turning.
Figure 5:
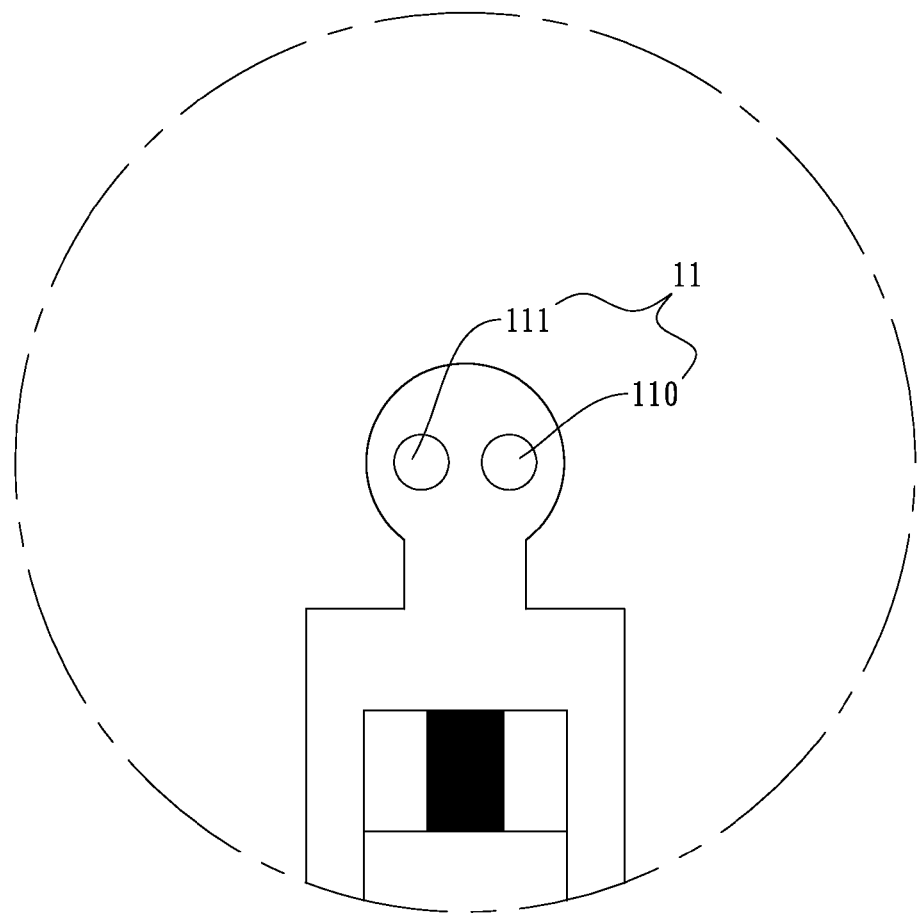
FIG. 5 is a detailed view of the area in circle A of FIG. 5.

Referring to FIGS. 1 to 5, a turning mechanism for polarized electronic components in accordance with a first preferred embodiment of the invention comprises the following components as discussed in detail below.

A carriage 1 is a disc-shaped rotatable table and comprises a plurality of receptacles 10 equally spaced around an annular edge. Each receptacle 10 is adapted to receive a polarized electronic component 6. An air channel 11 is formed in each receptacle 10 and comprises an air inlet 110 and an air outlet 111. The polarized electronic component 6 is an inductor, a capacitor, an LED, or an IC. A turn channel 2 is projected out of an edge of the carriage 1 and is shaped as an arc. The turn channel 2 comprises an inlet 20 and an outlet 21. A first sensor 200 is provided proximate to the inlet 20. A second sensor 210 is provided proximate to the outlet 22. The turn channel 2 is bulbous.

An auxiliary air passageway 3 is provided proximate to the first sensor 200 and projects out of the turn channel 2 a short distance. The auxiliary air passageway 3 is in fluid communication with the turn channel 2. The auxiliary air passageway 3 comprises an air outlet 30. A polarity detector 4 is provided externally of the carriage 1 and is proximate to the inlet 20. The polarity detector 4 is adapted to detect the polarity of the polarized electronic component 6. The polarized electronic component 6 in the receptacle 10 can be conveyed to a next stage in a packaging process by the carriage 1 if polarity of the polarized electronic component 6 is placed correctly. Also, air may be fed through the air inlet 110.

However, a number of steps will be taken if polarity of the polarized electronic component 6 is placed incorrectly as a result of the polarity detection by the polarity detector 4. In detail, air may be exited through the air outlet 111 and this can neutralize the vacuum in the air channel 11 maintained by the air inlet 110. And in turn, the polarized electronic component 6 may be pushed into the turn channel 2 by air via the inlet 20. And in turn, air stops exiting through the air outlet 111. As such, air only passes through the air inlet 110. Also, the polarized electronic component 6 moves along curved path of the turn channel 2 by passing the first sensor 200. The sensed first sensor 200 may activate the air outlet 30 to cause air to flow through. The air may push the polarized electronic component 6 forward along the curved path of the turn channel 2. This can prevent the vacuum in the receptacle 10 (maintained by the normally-on air inlet 110) from sucking the polarized electronic component 6 back into the receptacle 10. Thus, the polarized electronic component 6 may successfully move toward to the outlet 21. It is noted that the width of the turn channel 2 is sufficiently large to allow the polarized electronic component 6 to pass freely.

The second sensor 210 may sense the passing of the polarized electronic component 6 and thus cause the air outlet 30 to stop air flowing. Air in the air channel 11 may suck the polarized electronic component 6 into the receptacle 10 which has its polarity being disposed correctly (i.e., not reversed as prior to the steps). This polarity correction process is done sequentially without slowing the packaging process. Further, it is done correctly due to the electronic components of the turn channel 2.

Figure 6:
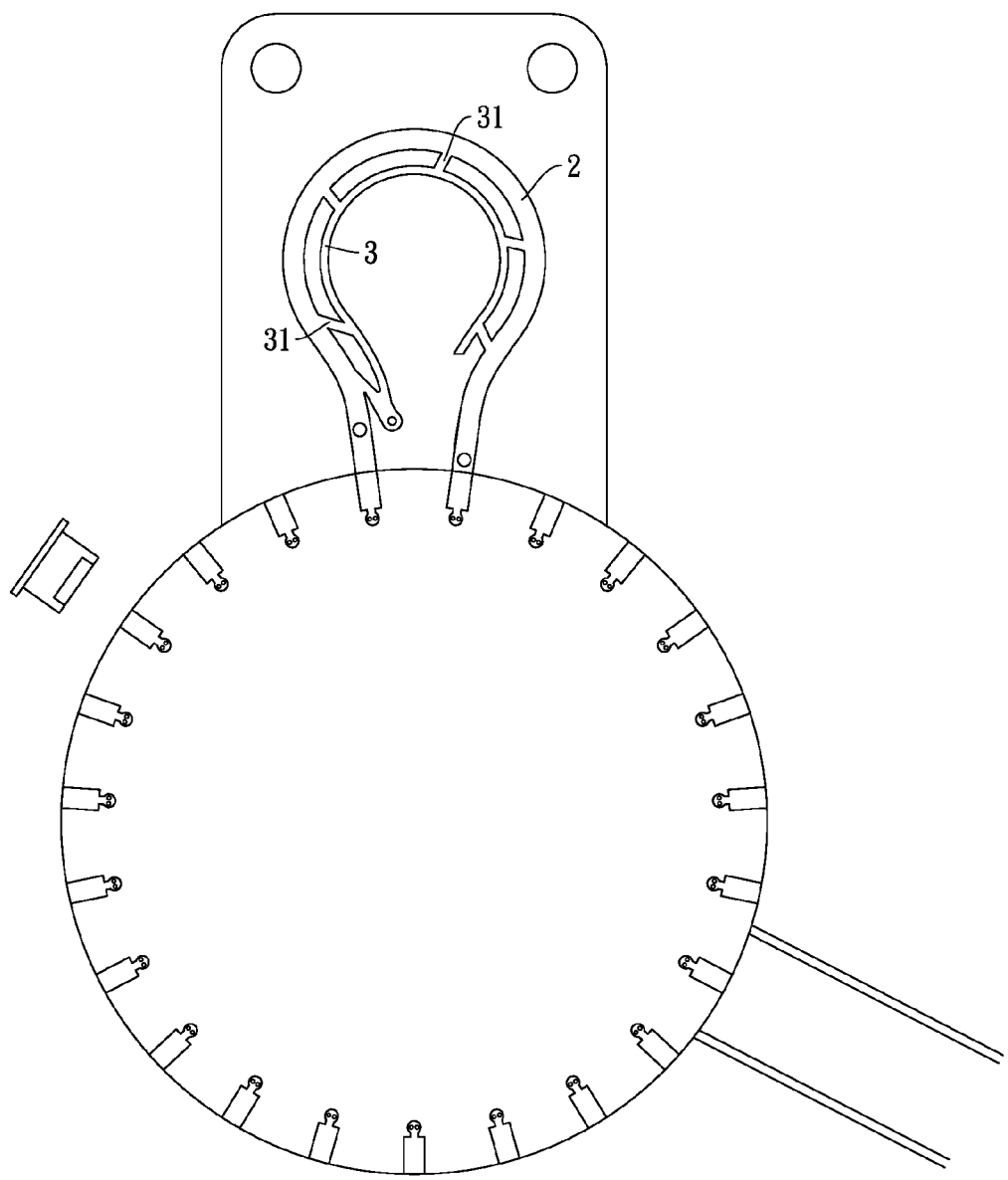
FIG. 6 is a top plan view of a turning mechanism for polarized electronic components according to a second preferred embodiment of the invention.
Figure 7:
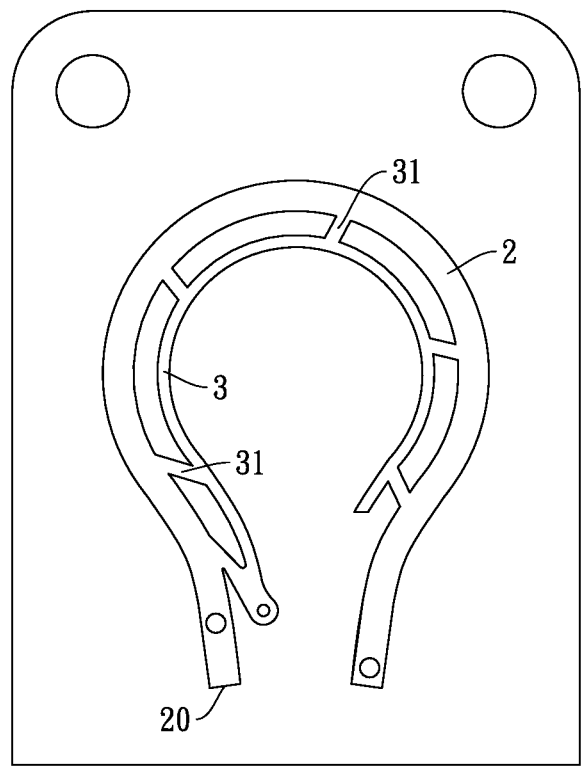
FIG. 7 is an enlarged view of the turning mechanism in FIG. 6.
Figure 8:
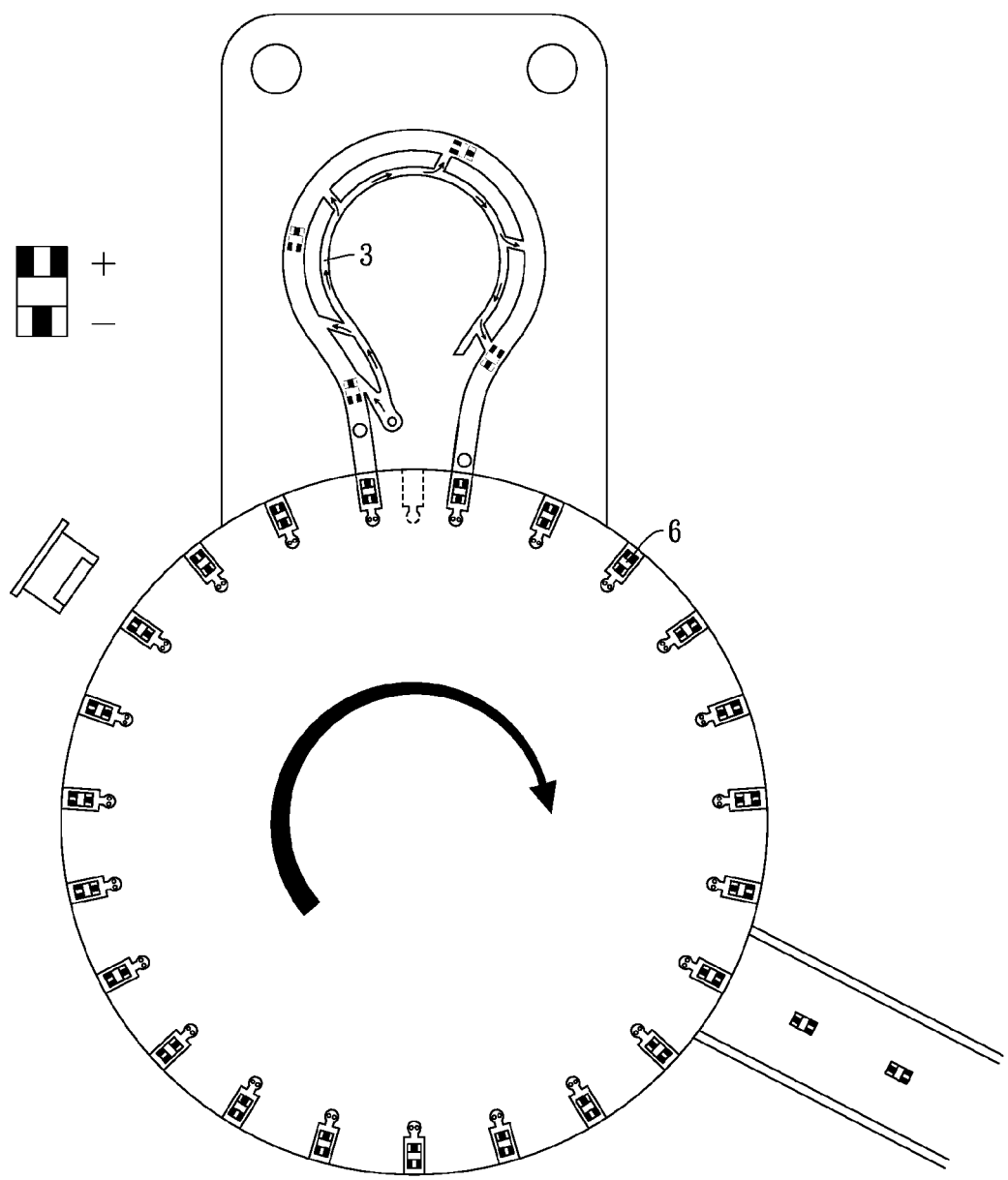
FIG. 8 is a view similar to FIG. 6 showing polarized electronic components loaded on the carriage being turned by the turning mechanism.

Referring to FIGS. 6 to 8, a turning mechanism for polarized electronic components in accordance with a second preferred embodiment of the invention is shown. The characteristics of the second preferred embodiment are substantially the same as that of the first preferred embodiment except the following:

The auxiliary air passageway 3 is an arc and is disposed in a spaced fashion from an inner edge of the turn channel 2. A plurality of short spaced ducts 31 interconnect the auxiliary air passageway 3 and the turn channel 2. The provision of the ducts 31 can increase the amount of air supplying to the turn channel 2 so as to facilitate the movement of the polarized electronic component 6 along the curved path of the turn channel 2 toward the outlet 20. In short, it can increase the performance of the invention.

Figure 9:
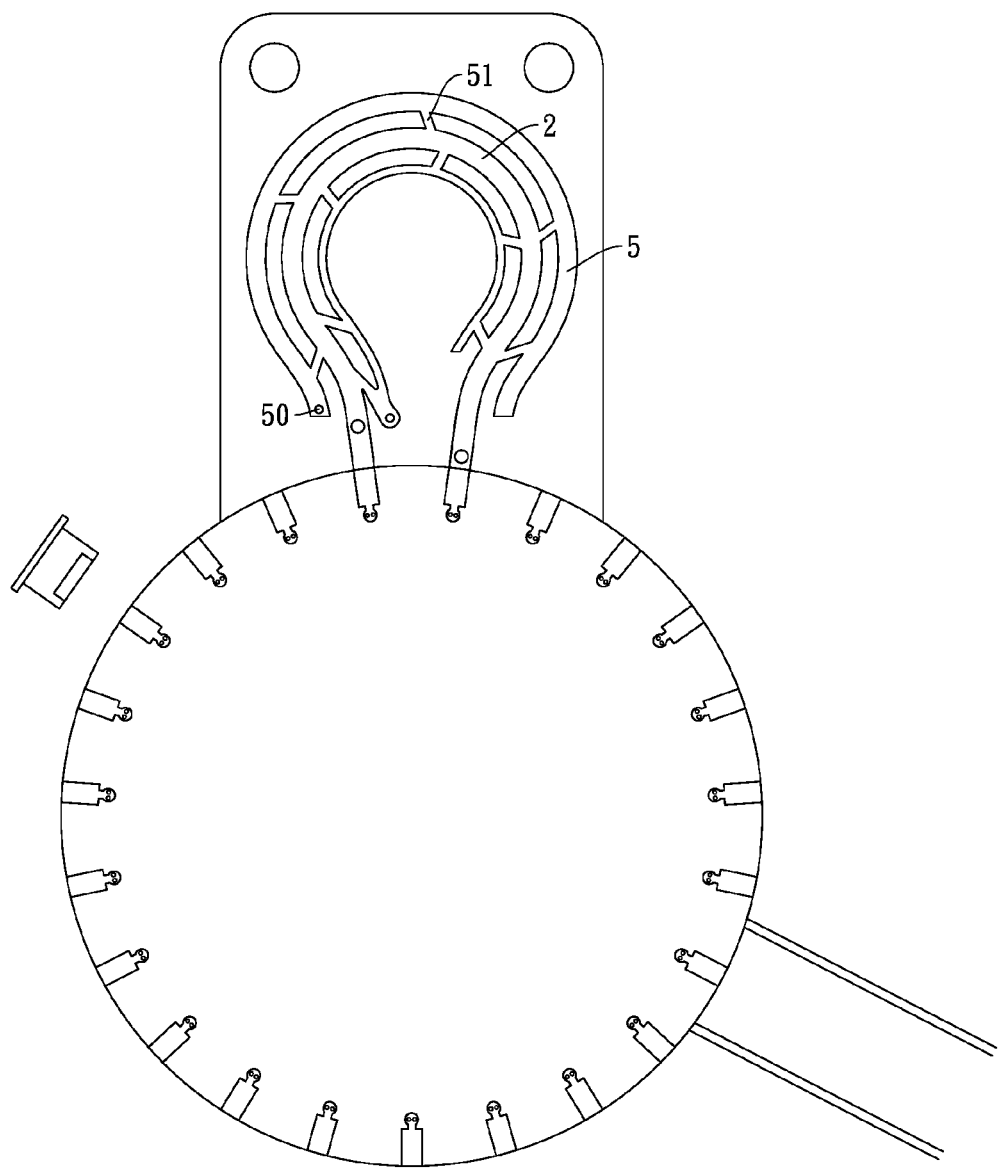
FIG. 9 is a top plan view of a turning mechanism for polarized electronic components according to a third preferred embodiment of the invention.
Figure 10:
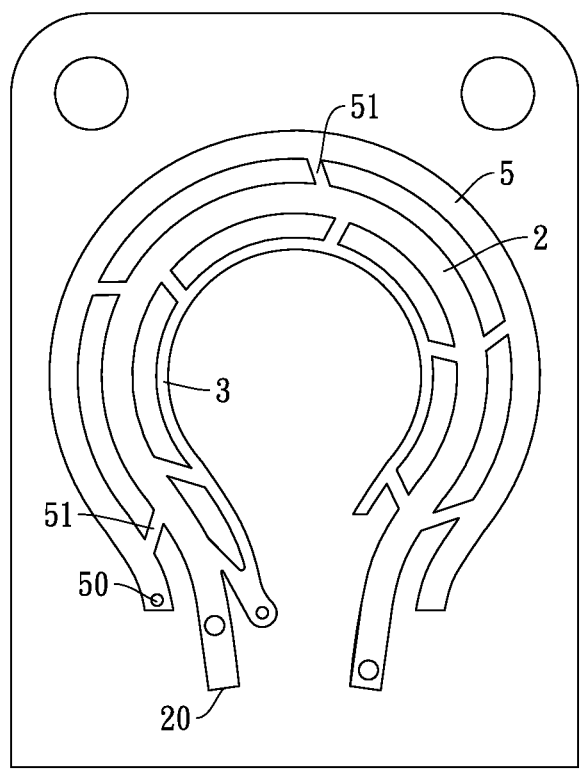
FIG. 10 is an enlarged view of the turning mechanism in FIG. 9.
Figure 11:
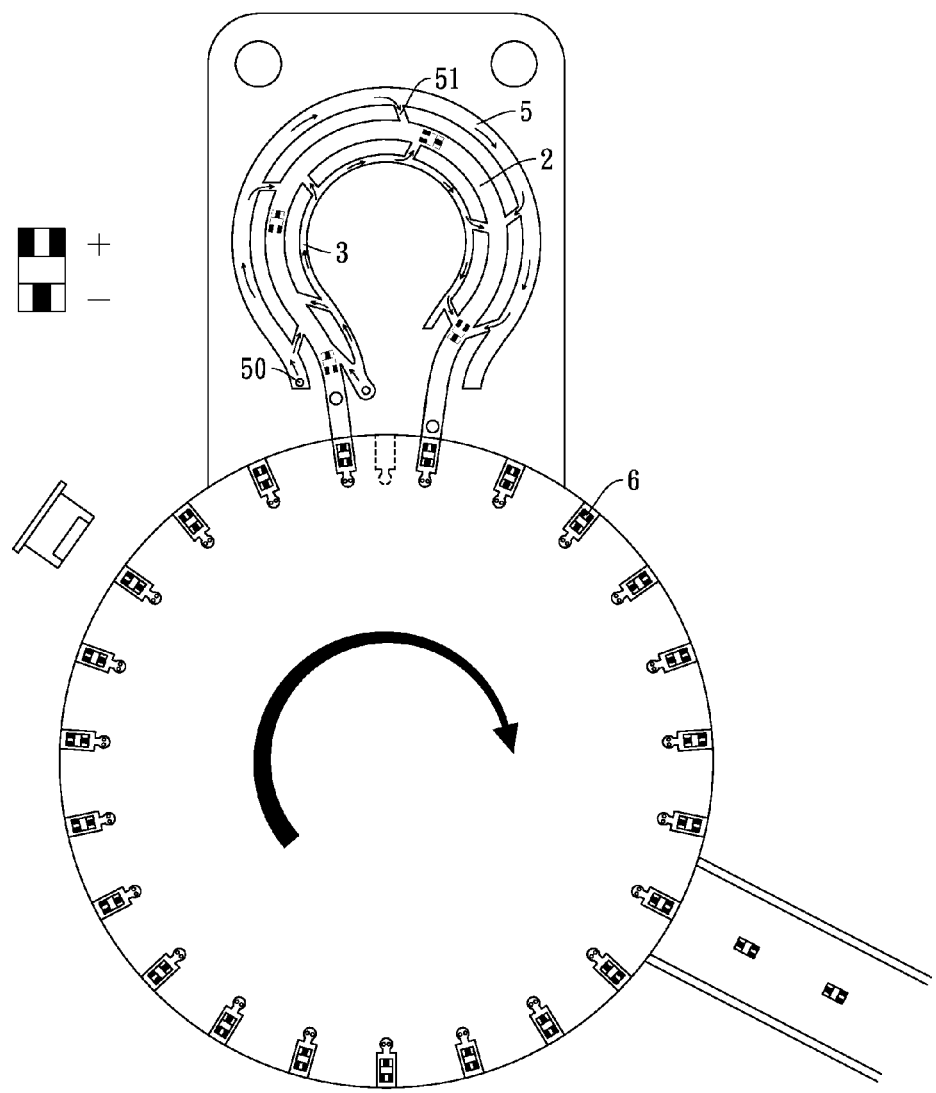
FIG. 11 is a view similar to FIG. 9 showing polarized electronic components loaded on the carriage being turned by the turning mechanism.

Referring to FIGS. 9 to 11, a turning mechanism for polarized electronic components in accordance with a third preferred embodiment of the invention is shown. The characteristics of the third preferred embodiment are substantially the same as that of the second preferred embodiment except the following:

An additional auxiliary air passageway 5 is provided. The additional auxiliary air passageway 5 is an arc and is disposed in a spaced fashion from an outer edge of the turn channel 2. That is, the additional auxiliary air passageway 5, the turn channel 2, and the auxiliary air passageway 3 are substantially concentric. The additional auxiliary air passageway 5 comprises an air outlet 50 and a plurality of short spaced ducts 51 interconnecting the auxiliary air passageway 3 and the turn channel 2. The provision of the ducts 31 can further increase the amount of air supplying to the turn channel 2 so as to facilitate the movement of the polarized electronic component 6 along the curved path of the turn channel 2 toward the outlet 20. In short, it can further increase the performance of the invention.

While the invention has been described in terms of preferred embodiments, those skilled in the art will recognize that the invention can be practiced with modifications within the spirit and scope of the appended claims.

What is claimed is:

1. A turning apparatus comprising:
   a disc-shaped rotatable carriage (1) comprising a plurality of receptacles (10) spaced around an edge, each receptacle (10) being adapted to receive one of a plurality of polarized electronic components (6) and including an air channel (11);
   a turn channel (2) projecting out of the edge of the carriage (1), the turn channel (2) being an arc and comprising an inlet (20) communicating with one of the receptacles (10) and including a first sensor (200), and an outlet (21) communicating with an adjacent one of the receptacles (10) and including a second sensor (210);
   an auxiliary air passageway (3) disposed proximate to the first sensor (200) and projecting inward out of the turn channel (2), the auxiliary air passageway (3) communicating with the turn channel (2) and comprising an air outlet (30); and
   a polarity detector (4) disposed externally of the carriage (1) and being proximate to the inlet (20), the polarity detector (4) being adapted to detect polarity of the polarized electronic component (6) proximate thereto.

2. The turning apparatus of claim 1, wherein the auxiliary air passageway (3) further comprises a plurality of spaced ducts (31) connecting to the turn channel (2) for communication.

3. The turning apparatus of claim 1, further comprises an auxiliary air passage (5) externally of the turn channel (2), the auxiliary air passage (5) comprising an air outlet (50) and a plurality of spaced ducts (51) connecting to the turn channel (2) for communication.

4. The turning apparatus of claim 1, wherein the receptacles (10) are equally spaced around the edge of the carriage (1).

5. The turning apparatus of claim 1, wherein the polarized electronic components (6) are inductors.

6. The turning apparatus of claim 1, wherein the polarized electronic components (6) are light-emitting diodes (LEDs).

7. The turning apparatus of claim 1, wherein the polarized electronic components (6) are integrated circuits (ICs).

8. The turning apparatus of claim 1, wherein the turn channel (2) is bulbous.

9. The turning apparatus of claim 1, wherein the air channel (11) comprises an air inlet (110) and an air outlet (111).

* * * * *